(12) United States Patent
Liu et al.

(10) Patent No.: US 10,148,236 B1
(45) Date of Patent: Dec. 4, 2018

(54) OUTPUT STAGE OF OPERATIONAL AMPLIFIER AND METHOD IN THE OPERATIONAL AMPLIFIER

(71) Applicant: Beken Corporation, Shanghai (CN)

(72) Inventors: Jiazhou Liu, Shanghai (CN); Dawei Guo, Shanghai (CN)

(73) Assignee: BEKEN CORPORATION, Shanghai (CN)

( * ) Notice: Subject to any disclaimer, the term of this patent is extended or adjusted under 35 U.S.C. 154(b) by 13 days.

(21) Appl. No.: 15/687,539

(22) Filed: Aug. 27, 2017

(30) Foreign Application Priority Data

Aug. 17, 2017 (CN) .......................... 2017 1 0707753

(51) Int. Cl.
*H03F 3/45* (2006.01)
*H03F 3/30* (2006.01)
*H03F 1/30* (2006.01)

(52) U.S. Cl.
CPC ......... *H03F 3/45224* (2013.01); *H03F 1/307* (2013.01); *H03F 3/3022* (2013.01); *H03F 3/45183* (2013.01)

(58) Field of Classification Search
CPC .... H03F 3/45; H03F 3/45179; H03F 3/45183; H03F 3/45188; H03F 3/45192; H03F 2200/177; H03F 1/307; H03F 3/30; H03F 3/3001; H03F 3/3022; H03F 2203/30009; H03F 3/45174; H03F 3/45273

USPC ................ 330/253, 255, 257, 262, 264, 288
See application file for complete search history.

(56) References Cited

U.S. PATENT DOCUMENTS

| | | | | |
|---|---|---|---|---|
| 6,542,034 B2* | 4/2003 | Tomasini | ............. | H03F 3/3001 330/255 |
| 8,149,056 B2* | 4/2012 | Pontarollo | ............ | H03F 1/0261 330/255 |
| 8,242,843 B2* | 8/2012 | Yuasa | ................... | H03F 3/3022 330/264 |
| 8,547,175 B2* | 10/2013 | Tomioka | ................ | H03F 3/347 330/264 |
| 2011/0050342 A1* | 3/2011 | Yuasa | ................... | H03F 3/3022 330/255 |
| 2017/0359041 A1* | 12/2017 | Morley | .................... | H03F 3/19 |

* cited by examiner

*Primary Examiner* — Khanh V Nguyen
(74) *Attorney, Agent, or Firm* — Perkins Coie LLP

(57) ABSTRACT

An embodiment discloses an operational amplifier comprising: an input stage; an output stage communicatively coupled to the input stage, wherein the output stage further comprises a first transistor, a second transistor, a third transistor, a fourth transistor, a first current source, a fifth transistor, a sixth transistor and a second current source, wherein a second node of the first transistor is connected to the input stage (vin), a third node of the first transistor is connected to a third node of the fourth transistor, ground (gnd), a third node of the fifth transistor and a third node of the third transistor, a first node of the first transistor is connected to a first node of the first current source, a second node of the sixth transistor and a second node of the second transistor.

9 Claims, 6 Drawing Sheets

OUTPUT STAGE OF OPERATIONAL AMPLIFIER AND METHOD IN THE OPERATIONAL AMPLIFIER

CROSS REFERENCE OF RELATED APPLICATIONS

This application claims priority to Chinese Application number 201710707753.X entitled "operational amplifier and method in the operational amplifier," filed on Aug. 17, 2017 by Beken Corporation, which is incorporated herein by reference.

TECHNICAL FIELD

The present application relates to circuits and more particularly, but not exclusively, to an operational amplifier and method in the operational amplifier.

BACKGROUND

Conventional output stage of class AB operational amplifier needs a relatively high output stage biasing to generate a normal operation voltage, such as a sum of at least two gates to source voltage in field effect transistors (Vgs). Otherwise, the operational amplifier may not work properly.

SUMMARY

An operational amplifier comprises an input stage; an output stage communicatively coupled to the input stage, wherein the output stage comprises a first transistor, a second transistor, a third transistor, a fourth transistor, a first current source, a fifth transistor, a sixth transistor and a second current source; wherein a second node of the first transistor is connected to the input stage (vin), a third node of the first transistor is connected to a third node of the fourth transistor, ground (gnd), a third node of the fifth transistor and a third node of the third transistor, a first node of the first transistor is connected to a first node of the first current source, a second node of the sixth transistor and a second node of the second transistor; a third node of the sixth transistor and second node of the second current source, a second node of the first current source, and a third node of the second transistor are connected to a power supply (Vdd); a first node of the second transistor is connected to a first node of the third transistor and configured to output voltage (vo); a second node of the third transistor is connected to a connection point between a first node of the fifth transistor and a first node of the second current source; and both a first node and a second node of the fourth transistor are connected to both a second node of the fifth transistor and a first node of the sixth transistor.

Another operational amplifier comprises an input stage; an output stage communicatively coupled to the input stage, wherein the output stage comprises a second transistor, a third transistor, a fourth transistor, a fifth transistor, a sixth transistor and a second current source, a third node of the fifth transistor and a third node of the third transistor are connected to a power supply (Vdd), a second node of the sixth transistor is connected to the input stage and connected to a second node of the second transistor; a third node of the sixth transistor and a first node of the second current source, and a third node of the second transistor are connected to ground (gnd), both a second node and a first node of the fourth transistor are connected to the second node of the fifth transistor; a first node of the second transistor is connected to a first node of the third transistor and configured to output voltage (vo); a second node of the third transistor is connected to a connection point between the first node of the second current source and a first node of the seventh transistor; and both a first node and a second node of the fourth transistor are connected to both a second node of the fifth transistor and a first node of the sixth transistor.

A method in an operational amplifier, wherein the operational amplifier comprises an input stage; an output stage communicatively coupled to the input stage, wherein the output stage further comprises a first transistor, a second transistor, a third transistor, a fourth transistor, a first current source, a fifth transistor, a sixth transistor and a second current source; wherein a second node of the first transistor is connected to the input stage (vin), a third node of the first transistor is connected to a third node of the fourth transistor, ground (gnd), a third node of the fifth transistor and a third node of the third transistor, a first node of the first transistor is connected to a first node of the first current source, second node of the sixth transistor and a second node of the second transistor; a third node of the sixth transistor and second node of the second current source, a second node of the first current source, and a third node of the second transistor are connected to a power supply (Vdd); a first node of the second transistor is connected to a first node of the third transistor and configured to output voltage (vo); a second node of the third transistor is connected to a connection point between a first node of the fifth transistor and a first node of the second current source; and both a first node and a second node of the fourth transistor are connected to both second node of the fifth transistor and a first node of the sixth transistor; wherein the method comprises receiving, by the input stage, input voltage; and outputting, by a connection point of the first node of the second transistor and the first node of the third transistor, the output voltage, wherein the third transistor is always on.

A method in an operational amplifier, wherein the operational amplifier comprises an input stage; an output stage communicatively coupled to the input stage, wherein the output stage comprises a second transistor, a third transistor, a fourth transistor, a fifth transistor, a sixth transistor and a second current source, a third node of the fifth transistor and a third node of the third transistor are connected to a power supply (Vdd), a second node of the sixth transistor is connected to the input stage and connected to a second node of the second transistor; a third node of the sixth transistor and a first node of the second current source, and a third node of the second transistor are connected to ground (gnd), both a second node and a first node of the fourth transistor are connected to the second node of the fifth transistor; a first node of the second transistor is connected to a first node of the third transistor and configured to output voltage (vo); a second node of the third transistor is connected to a connection point between the first node of the second current source and a first node of the fifth transistor; and both a first node and a second node of the fourth transistor are connected to both a second node of the fifth transistor and a first node of the sixth transistor; wherein the method comprises receiving, by the input stage, input voltage;

and outputting, by a connection point of the first node of the second transistor and the first node of the third transistor, the output voltage, wherein the second transistor is always on.

According to embodiments of the invention, the operational amplifier can be operated with lower operation voltage, such that the operational amplifier can be operated in more scenarios.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

DETAILED DESCRIPTION OF THE ILLUSTRATED EMBODIMENTS

Various aspects and examples of the invention will now be described. The following description provides specific details for a thorough understanding and enabling descriptive examples. Those skilled in the art will understand, however, that the invention may be practiced without many of these details. Additionally, some well-known structures or functions may not be shown or described in detail, so as to avoid unnecessarily obscuring the relevant description.

The terminology used in the description presented below is intended to be interpreted in its broadest reasonable manner, even though it is being used in conjunction with a detailed description of certain specific examples of the invention. Certain terms may even be emphasized below, however, any terminology intended to be interpreted in any restricted manner will be overtly and specifically defined as such in this Detailed Description section.

Figure 1:
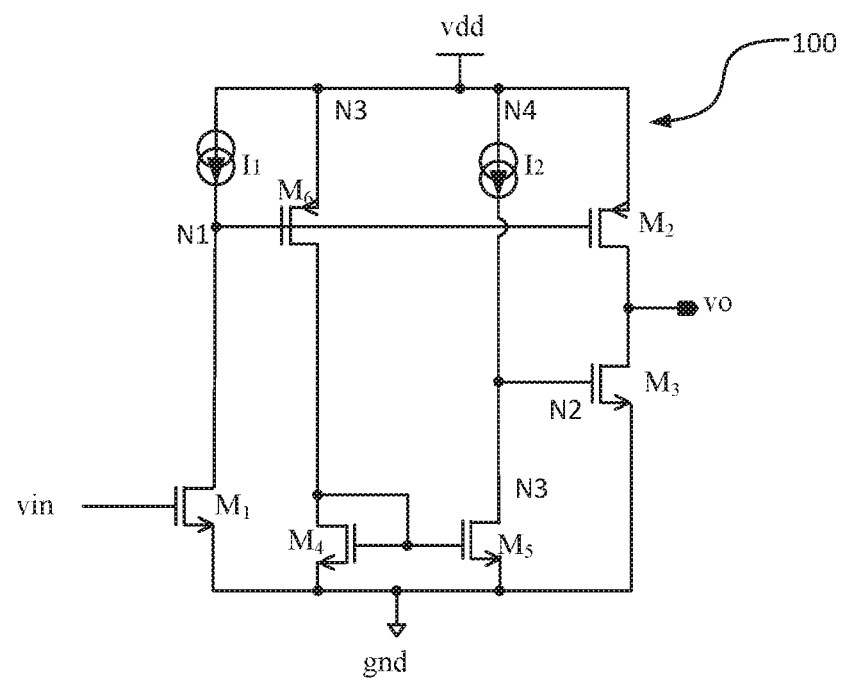
FIG. 1 is a circuit diagram illustrating an output stage of an operational amplifier according an embodiment of the invention.

FIG. 1 is a circuit diagram illustrating an output stage of an operational amplifier 100 according an embodiment of the invention.

The operational amplifier 100 comprises an input stage Vin, and an output stage communicatively coupled to the input stage. The output stage comprises a first transistor $M_1$, a second transistor $M_2$, a third transistor $M_3$, a fourth transistor $M_4$, a first current source $I_1$, a fifth transistor $M_5$, a sixth transistor $M_6$ and a second current source $I_2$.

A second node of the first transistor $M_1$ is connected to the input stage vin. A third node of the first transistor $M_1$ is connected to a third node of the fourth transistor $M_4$, ground gnd, a third node of the fifth transistor $M_5$ and a third node of the third transistor $M_3$. A first node of the first transistor $M_1$ is connected to a first node of the first current source $I_1$, a second node of the sixth transistor $M_6$ and a second node of the second transistor $M_2$. Note without loss of generality, a first node of a current source represents the side where an arrow is point to, that is, towards the direction the current flows to, while a second node of a current source represents the opposite side of the current flow, that is, where the current flows from.

A third node of the sixth transistor $M_6$ and second node of the second current source $I_2$, a second node of the first current source $I_1$, and a third node of the second transistor $M_2$ are connected to a power supply Vdd.

A first node of the second transistor $M_2$ is connected to a first node of the third transistor $M_3$ and configured to output voltage vo.

A second node of the third transistor $M_3$ is connected to a connection point between a first node of the fifth transistor $M_5$ and a first node of the second current source $I_2$.

Both a first node and a second node of the fourth transistor $M_4$ are connected to both a second node of the fifth transistor $M_5$ and a first node of the sixth transistor $M_6$.

Figure 2:
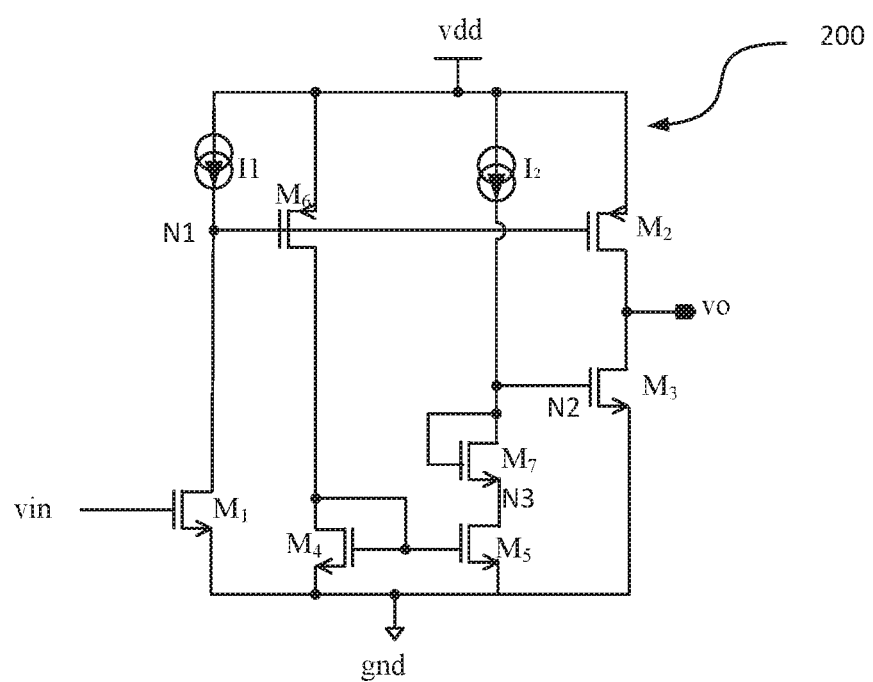
FIG. 2 is a circuit diagram illustrating an output stage of an operational amplifier according another embodiment of the invention.

FIG. 2 shows another embodiment of the circuit diagram for the operational amplifier 200. In addition to including all the circuit elements shown in the circuit 100 of FIG. 1, the operational amplifier 200 further comprises a seventh transistor $M_7$. The seventh transistor $M_7$ is connected in serial between the first node of fifth transistor $M_5$ and the first node of the second current source $I_2$, and a connection point between the first node of the second current source $I_2$ and a second node of the seventh transistor $M_7$ is connected to a first node of the seventh transistor $M_7$.

Referring to FIG. 2, wherein the first transistor $M_1$, the third transistor $M_3$, the fourth transistor $M_4$, the fifth transistor $M_5$ and the seventh transistor $M_7$ are NMOS transistors. The second transistor $M_2$ and the sixth transistor M6 are PMOS transistors.

Further, the first nodes of the first, second, third, fourth, fifth, sixth and seventh transistors $M_1$, $M_2$, $M_3$, $M_4$, $M_5$, $M_6$ and $M_7$ each comprise a drain. The second nodes of the first, second, third, fourth, fifth, sixth and seventh transistors $M_1$, $M_2$, $M_3$, $M_4$, $M_5$, $M_6$ and $M_7$ each comprise a gate. The third nodes of the first, second, third, fourth, fifth, sixth and seventh transistors $M_1$, $M_2$, $M_3$, $M_4$, $M_5$, $M_6$ and $M_7$ each comprise a source.

Referring to FIG. 2, when the input circuit is in an equilibrium state, the current passing through the second transistor $M_2$ equals to the current passing through the third transistor $M_3$. Further, a loop including the fifth transistor $M_5$, the sixth transistor $M_6$, the seventh transistor $M_7$ and the second current source $I_2$ determines a gate voltage of the third transistor $M_3$. When vin rises, the voltage on the point N1 decreases, therefore the current passing through the second transistor $M_2$ and the sixth transistor $M_6$ increases, therefore gate voltages of the fourth transistor $M_4$ and the fifth transistor $M_5$ rise, and gate voltage on the third transistor $M_3$ drops. When the current passing through the third transistor $M_3$ decreases to be a multiple times of the current of the second current source $I_2$, the current passing through the third transistor $M_3$ will no longer decease (the multiplier is determined by the ratio of the third transistor $M_3$ and the seventh transistor $M_7$). However, the current passing through the second transistor $M_2$ will continue to rise with the rise of vin, and the excess current is used to drive the external load.

When the voltage of input stage vin drops, the current passing through the second transistor M2 and the sixth transistor M6 begins to decrease. The gate voltages of the fourth transistor M4 and the fifth transistor M5 begin to drop, and the current passing through the fifth transistor M5 decreases. Therefore the gate voltage of the third transistor M3 rises, and the current passing through the third transistor M3 starts to rise. The current passing through the second transistor M2 begins to drop until the current passing through the second transistor M2 reaches a multiple of the current of I2, which is determined by both the ratio of the sixth transistor M6 and the second transistor M2 and the ratio of the fourth transistor M4 and the fifth transistor M5.

Therefore the minimum operational voltage, that is vdd, can be higher than the larger one between the voltage between gate and source of the second transistor M2 (Vgs2) and the voltage between gate and source of the third transistor M3(Vgs3). Note the lowest voltage on N1 is 0, therefore vdd>vgs(m2). Meanwhile the maximum voltage on N2 is Vdd, therefore , Vdd>vgs(M3). Therefore Vdd should be larger than the both vgs(M2) and Vgs (M3).

Referring back to FIG. 1, in FIG. 1, the circuit does not include the seventh transistor M7. When the voltage at a first node N1 (VN1) decreases, the absolute value increases, and the current passing through the sixth transistor M6 increases. As a result, the current passing through the fourth and fifth transistors M4 and M5 increase. Since the second current source I2 maintains unchanged, the current IN2 passing through the second node N2, which corresponds a second node of the third transistor M3, may be 0. Therefore the voltage at the third node N3, which is the first node of the fifth transistor M5 may be zero. Therefore the third transistor M3 is off. In other words, in the operational amplifier 100 shown in FIG. 1, the third transistor M3 may be on or off depending on the voltage of VN1, or input stage voltage vin. When vin increases, VN1 decreases, and when vin decreases, VN1 increases. On the other hand, the second transistor M2 is always on no matter what is the input stage voltage vin. If the operational amplifier operates normally, M6 is always on, therefore M2 is always on. If M2 is off then the circuit enters slew rate, and M2 is finally on when in an equilibrium state. In other words, the operational voltage (vdd) may be higher than the Vgs of both the second transistor M2 and the third transistor M3. Note if Vdd is lower than vgs(M3), then M3 will not be on, and there is no pull down current. If the output stage drives ground resistor, then the circuit works. However if the output stage drives a power supply resistor, the circuit does not work because there is no pull down power. The operational amplifier 100 in FIG. 1 may be a class AB type operational amplifier, or a class B type operational amplifier when the third transistor does not work.

In comparison to FIG. 1, the operational amplifier 200 in FIG. 2 further comprises a seventh transistor $M_7$. With the presence of the seventh transistor $M_7$, there is always a current passing through the seventh transistor $M_7$ as long as there is a positive power supply voltage vdd. Therefore, there is always a current passing through the gate of the third transistor $M_3$. In other words, in the operational amplifier 200 shown in FIG. 2, the third transistor $M_3$ is always on. Further, the second transistor $M_2$ is always on no matter what is the input stage voltage vin. The operational amplifier 200 in FIG. 2 is a class AB type operational amplifier.

Figure 3:
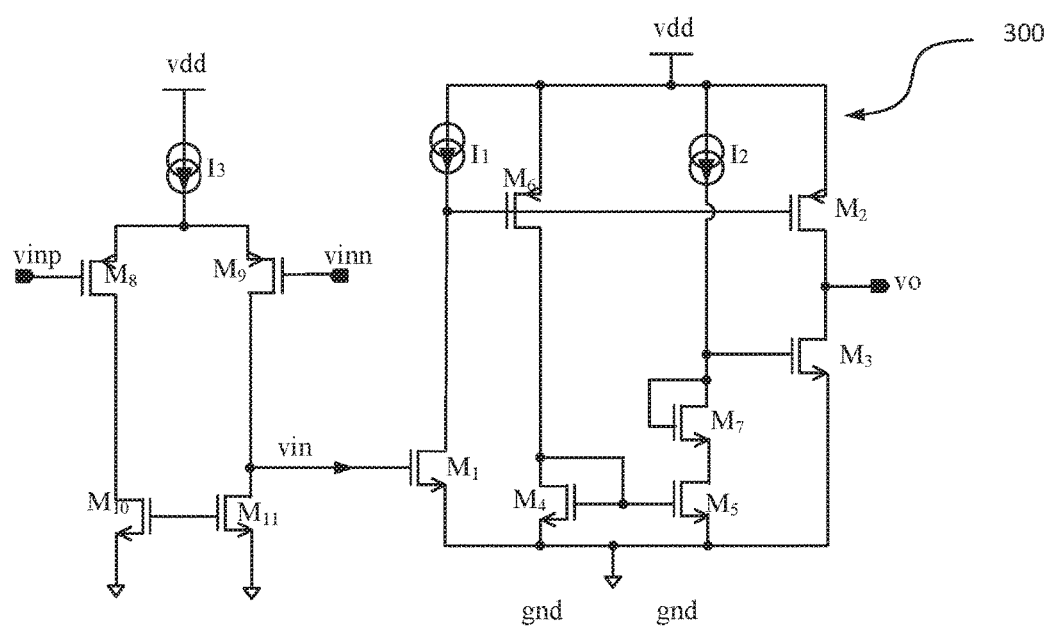
FIG. 3 is a circuit diagram illustrating an operational amplifier according an embodiment of the invention.

FIG. 3 is a circuit diagram illustrating an operational amplifier 300 according an embodiment of the invention. The output stage is the same as that has already been discussed with respect to FIG. 2, therefore its details are omitted for the clarity of description. The input stage further comprises an eighth transistor $M_8$, a ninth transistor $M_9$, a tenth transistor $M_{10}$ and an eleventh transistor $M_{11}$, and a third current source $I_3$.

A second node of the eighth transistor $M_8$ is configured to receive a positive input voltage vinp. A second node of the ninth transistor $M_9$ is configured to receive a negative input voltage vinn. Both a third node of the eighth transistor $M_8$ and a third node of the ninth transistor $M_9$ are connected to a first node of the third current source $I_3$. A second node of the third current source $I_3$ is connected to the power supply vdd.

A first node of the eighth transistor $M_8$ is connected to a first node of the tenth transistor $M_{10}$. A first node of the ninth transistor $M_9$ is connected to a first node of the eleventh transistor $M_{11}$. A second node of the ten transistor $M_{10}$ is connected to the second node of the eleventh transistor $M_{11}$. Both a third node of the tenth transistor $M_{10}$ and a third node of the eleventh transistor $M_{11}$ are connected to ground.

The eighth transistor $M_8$ and the ninth transistor $M_9$ comprise PMOS, and the tenth transistor $M_{10}$ and the eleventh transistor $M_{11}$ comprise NMOS.

The first node of the eighth, ninth, tenth and eleventh $M_8$, $M_9$, $M_{10}$ and $M_{11}$ transistors comprises a drain. The second node of the eighth, ninth, tenth and eleventh $M_8$, $M_9$, $M_{10}$ and $M_{11}$ transistors each comprises a gate. The third node of the eighth, ninth, tenth and eleventh transistors $M_8$, $M_9$, $M_{10}$ and $M_{11}$ each comprises a source.

Figure 4:
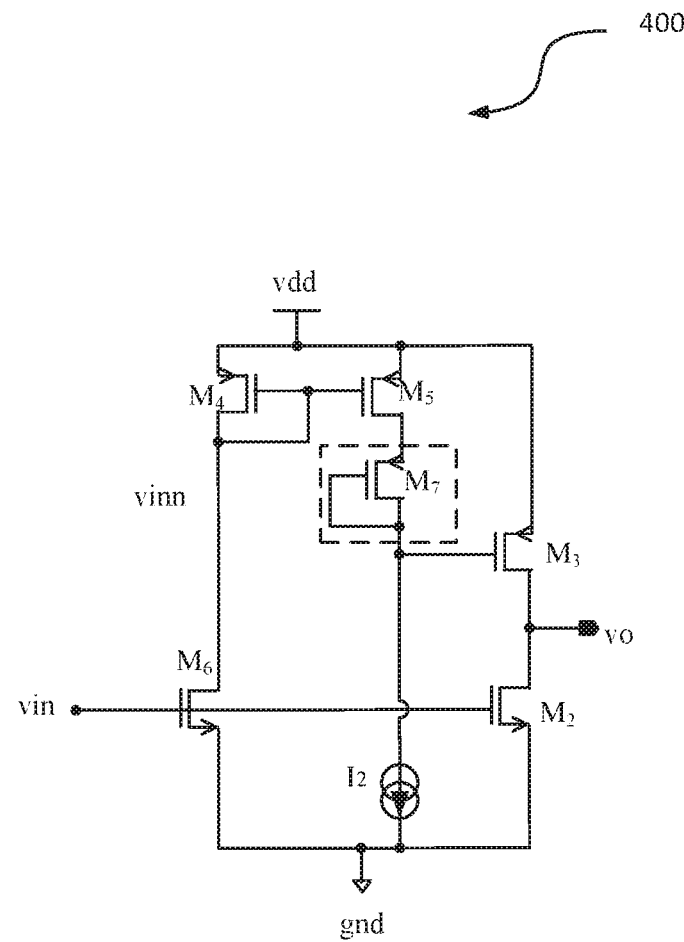
FIG. 4 is a circuit diagram illustrating an operational amplifier according another embodiment of the invention.

FIG. 4 is a circuit diagram illustrating an operational amplifier 400 according an embodiment of the invention. The operational amplifier comprises an input stage vin; an output stage communicatively coupled to the input stage vin, wherein the output stage comprises a second transistor $M_2$, a third transistor $M_3$, a fourth transistor $M_4$, a fifth transistor $M_5$, a sixth transistor $M_6$ and a second current source $I_2$.

A third node of the fifth transistor $M_5$ and a third node of the third transistor $M_3$ are connected to a power supply Vdd. A second node of the sixth transistor $M_6$ is connected to the input stage vin and connected to a second node of the second transistor $M_2$.

A third node of the sixth transistor $M_6$ and a first node of the second current source $I_2$, and a third node of the second transistor $M_2$ are connected to ground gnd. Both a second node and a first node of the fourth transistor $M_4$ are connected to the second node of the fifth transistor $M_5$. A first node of the second transistor $M_2$ is connected to a first node of the third transistor $M_3$ and configured to output voltage vo. A second node of the third transistor $M_3$ is connected to a connection point between the first node of the second current source $I_2$ and a first node of the fifth transistor $M_5$.

Both a first node and a second node of the fourth transistor $M_4$ are connected to both a second node of the fifth transistor and a first node of the sixth transistor $M_6$.

Alternatively, the operational amplifier 400 further comprises a seventh transistor $M_7$, which is shown in the dashed block which represents that the seventh transistor $M_7$ is optional. The seventh transistor $M_7$ is connected in serial between the first node of fifth transistor $M_5$ and the first node of the second current source $I_2$. A connection point between the first node of the second current source $I_2$ and a second node of the seventh transistor $M_7$ is connected to a first node of the seventh transistor $M_7$.

Figure 5:
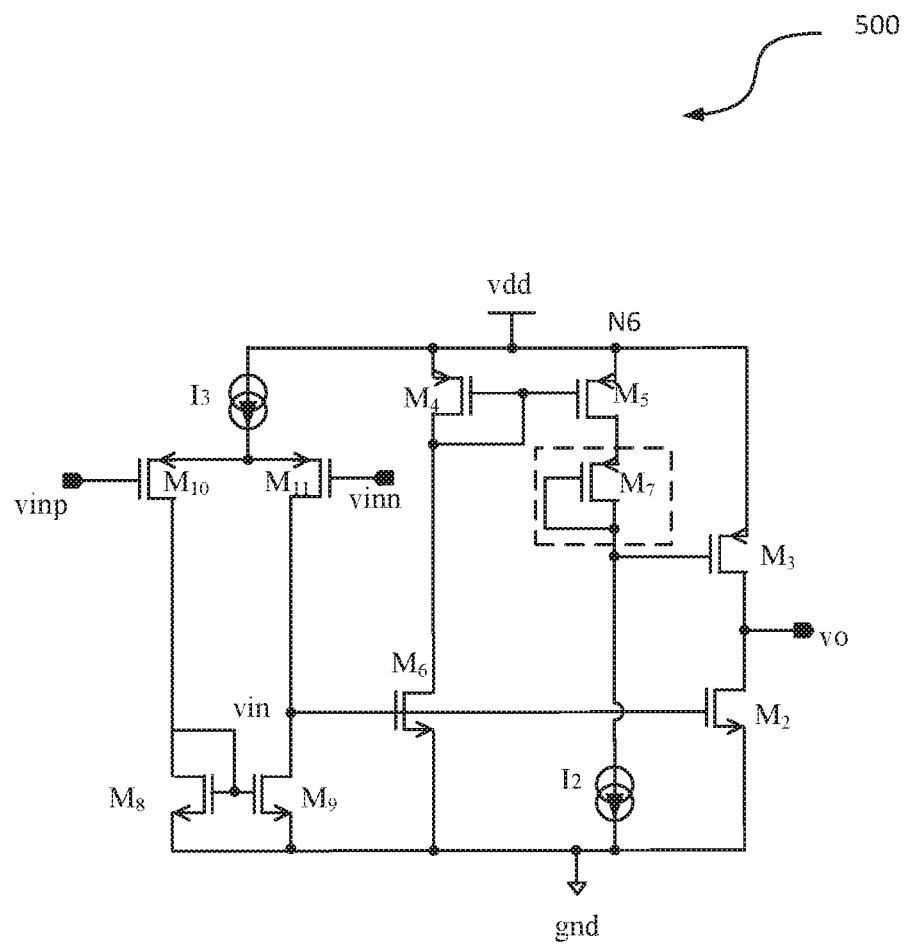
FIG. 5 is a circuit diagram illustrating an operational amplifier according another embodiment of the invention.

FIG. 5 is a circuit diagram illustrating an operational amplifier 500 according another embodiment of the invention. The output stage is the same as that has already been discussed with respect to FIG. 4, therefore its details are omitted for the clarity of description. The operational amplifier 500 further comprises an input stage. The input stage comprises a tenth transistor $M_{10}$, an eleventh transistor $M_{11}$, an eighth transistor $M_8$, a ninth transistor $M_9$ and a third current source $I_3$.

A second node of the tenth transistor M10 is configured to receive a positive voltage input vinp, and a second node of the eleventh transistor M11 is configured to receive a negative voltage input vinn. A third node of the tenth transistor M10 and a third node of the eleventh transistor M11 are connected to a first node of the third current source 13. A second node of the third current source 13 is connected to a power supply vdd, a first node of the eighth transistor M8 and a second node of the eighth transistor M8 are connected to a second node of the ninth transistor M9. Both a third node of the eighth transistor M8 and a third node of the ninth transistor M9 are connected to ground gnd.

Alternatively, the third transistor $M_3$, the fourth transistor $M_4$, the fifth transistor $M_5$, the seventh transistor $M_7$, the tenth transistor $M_{10}$ and the eleventh transistor $M_{11}$ are PMOS transistors, and the second transistor $M_2$, the sixth transistor $M_6$, the eighth transistor $M_8$ and the ninth transistor $M_9$ are NMOS transistors.

Further, the first node of the second, third, fourth, fifth, sixth, seventh, eighth, ninth, tenth and eleventh transistors $M_2$, $M_3$, $M_4$, $M_5$, $M_6$, $M_7$, $M_8$, $M_9$, $M_{10}$ and $M_{11}$ each comprises a drain. The second node of the second, third, fourth, fifth, sixth, seventh, eighth, ninth, tenth and eleventh transistors $M_2$, $M_3$, $M_4$, $M_5$, $M_6$, $M_7$, $M_8$, $M_9$, $M_{10}$ and $M_{11}$ each comprises a gate. The third node of the second, third, fourth, fifth, sixth, seventh, eighth, ninth, tenth and eleventh transistors $M_2$, $M_3$, $M_4$, $M_5$, $M_6$, $M_7$, $M_8$, $M_9$, $M_{10}$ and $M_{11}$ each comprises a source.

Figure 6:
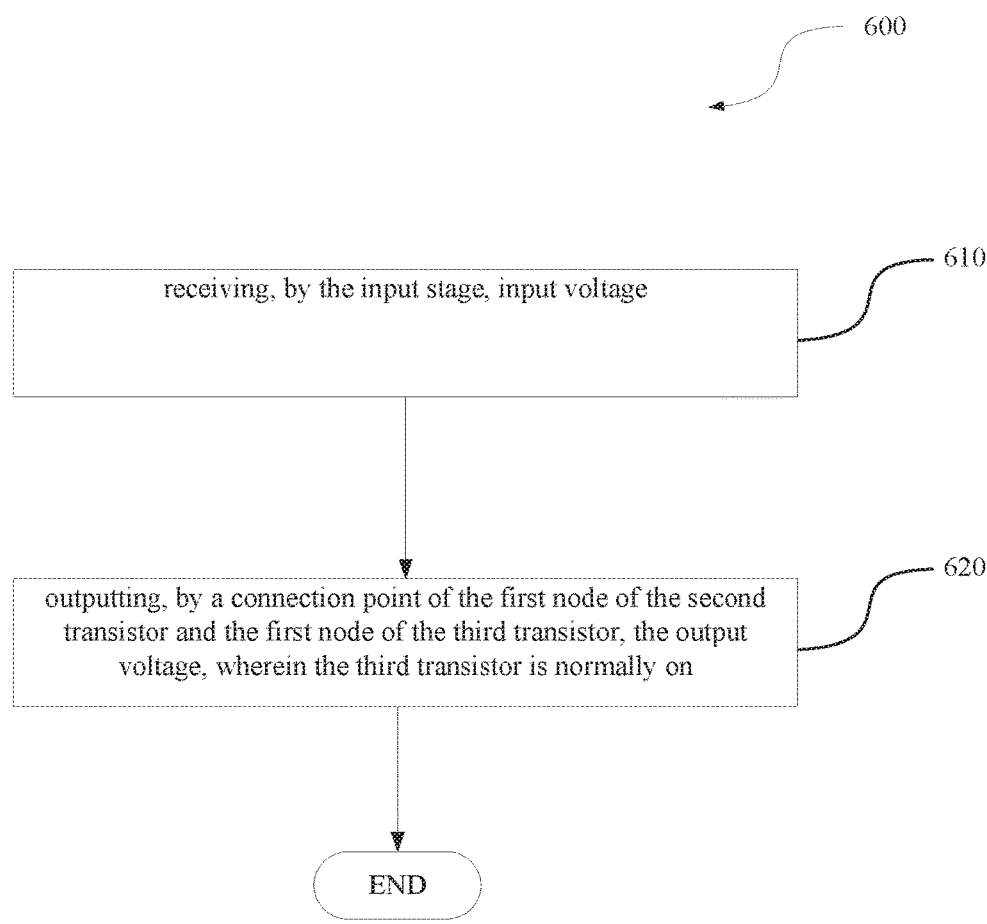
FIG. 6 is a flow chart diagram illustrating a method in an operational amplifier according an embodiment of the invention.

FIG. 6 is a flow chart diagram illustrating a method 600 in an operational amplifier according an embodiment of the invention. The operational amplifier comprises an input stage vin, and an output stage communicatively coupled to the input stage. The output stage comprises a first transistor $M_1$, a second transistor $M_2$, a third transistor $M_3$, a fourth transistor $M_4$, a first current source $I_1$, a fifth transistor $M_5$, a sixth transistor $M_6$ and a second current source $I_2$. A second node of the first transistor $M_1$ is connected to the input stage vin. A third node of the first transistor $M_1$ is connected to a third node of the fourth transistor $M_4$, ground gnd, a third node of the fifth transistor $M_5$ and a third node of the third transistor $M_3$. A first node of the first transistor $M_1$ is connected to a first node of the first current source $I_1$, a second node of the sixth transistor $M_6$ and a second node of the second transistor $M_2$. A third node of the sixth transistor $M_6$ and second node of the second current source $I_2$, a second node of the first current source $I_1$, and a third node of the second transistor $M_2$ are connected to a power supply Vdd. A first node of the second transistor $M_2$ is connected to a first node of the third transistor $M_3$ and configured to output voltage vo. A second node of the third transistor $M_3$ is connected to a connection point between a first node of the fifth transistor $M_5$ and a first node of the second current source $I_2$. Both a first node and a second node of the fourth transistor $M_4$ are connected to both a second node of the fifth transistor $M_5$ and a first node of the sixth transistor $M_6$. The method 600 comprises receiving in block 610, by the input stage, input voltage; and outputting in block 620, by a connection point of the first node of the second transistor $M_2$ and the first node of the third transistor $M_3$, the output voltage vo, wherein the second transistor $M_2$ is always on. Further, if the operational amplifier requires pull down power, vdd also should be larger than vgs(M3).

From the foregoing, it will be appreciated that specific embodiments of the technology have been described herein for purposes of illustration, however various modifications can be made without deviating from the spirit and scope of the present invention. Accordingly, the present invention is not restricted except in the spirit of the appended claims.

Other variations to the disclosed embodiments can be understood and effected by those skilled in the art in practicing the claimed invention, from a study of the drawings, the disclosure, and the appended claims. In the claims the word "comprising" does not exclude other elements or steps, and the indefinite article "a" or "an" does not exclude a plurality. Even if particular features are recited in different dependent claims, the present invention also relates to the embodiments including all these features. Any reference signs in the claims should not be construed as limiting the scope.

Features and aspects of various embodiments may be integrated into other embodiments, and embodiments illustrated in this document may be implemented without all of the features or aspects illustrated or described. One skilled in the art will appreciate that although specific examples and embodiments of the system and methods have been described for purposes of illustration, various modifications can be made without deviating from the spirit and scope of the present invention. Moreover, features of one embodiment may be incorporated into other embodiments, even where those features are not described together in a single embodiment within the present document. Accordingly, the invention is described by the appended claims.

What is claimed is:

1. An operational amplifier comprising:
    an input stage;
    an output stage communicatively coupled to the input stage, wherein the output stage comprises a first transistor, a second transistor, a third transistor, a fourth transistor, a first current source, a fifth transistor, a sixth transistor and a second current source,
    wherein a second node of the first transistor is connected to the input stage (vin), a third node of the first transistor is connected to a third node of the fourth transistor, ground (gnd), a third node of the fifth transistor and a third node of the third transistor, a first node of the first transistor is connected to a first node of the first current source, a second node of the sixth transistor and a second node of the second transistor;
    a third node of the sixth transistor and second node of the second current source, a second node of the first current source, and a third node of the second transistor are connected to a power supply (Vdd);
    a first node of the second transistor is connected to a first node of the third transistor and configured to output voltage (vo);
    a second node of the third transistor is connected to a connection point between a first node of the fifth transistor and a first node of the second current source; and
    both a first node and a second node of the fourth transistor are connected to both a second node of the fifth transistor and a first node of the sixth transistor.

2. The operational amplifier of claim 1, further comprising a seventh transistor, wherein
    the seventh transistor is connected in serial between the first node of fifth transistor and the first node of the second current source, and a connection point between the first node of the second current source and a second node of the seventh transistor is connected to a first node of the seventh transistor.

3. The operational amplifier of claim 2, wherein the first transistor, the third transistor, the fourth transistor, the fifth transistor and the seventh transistor are NMOS transistors, and the second transistor and the sixth transistor are PMOS transistors, wherein
    the first nodes of the first, second, third, fourth, fifth, sixth and seventh transistors each comprise a drain;
    the second nodes of the first, second, third, fourth, fifth, sixth and seventh transistors each comprise a gate; and
    the third nodes of the first, second, third, fourth, fifth, sixth and seventh transistors each comprise a source.

4. The operational amplifier of claim 3, wherein the input stage further comprises an eighth transistor, a ninth transistor, a tenth transistor and an eleventh transistor, and a third current source, wherein
- a second node of the eighth transistor is configured to receive a positive input voltage, a second node of the ninth transistor is configured to receive a negative input voltage, both a third node of the eighth transistor and a third node of the ninth transistor are connected to a first node of the third current source, and a second node of the third current source is connected to the power supply (vdd);
- a first node of the eighth transistor is connected to a first node of the tenth transistor, a first node of the ninth transistor is connected to a first node of the eleventh transistor, a second node of the ten transistor is connected to the second node of the eleventh transistor, both a third node of the tenth transistor and a third node of the eleventh transistor are connected to ground; wherein
- the eighth transistor and the ninth transistor comprise PMOS, and the tenth transistor and the eleventh transistor comprise NMOS; and
- the first node of the eighth, ninth, tenth and eleventh transistors comprises a drain;
- the second node of the eighth, ninth, tenth and eleventh transistors comprises a gate; and
- the third node of the eighth, ninth, tenth and eleventh transistors comprises a source.

5. An operational amplifier comprising:
an input stage;
an output stage communicatively coupled to the input stage, wherein the output stage comprises a first transistor, a second transistor, a third transistor, a fourth transistor, a fifth transistor, and a first current source,
a third node of the fifth transistor and a third node of the third transistor are connected to a power supply (Vdd), a second node of the first transistor is connected to the input stage and connected to a second node of the second transistor;
a third node of the first transistor and a first node of the first current source, and a third node of the second transistor are connected to ground (gnd), both a second node and a first node of the fourth transistor are connected to the second node of the fifth transistor;
a first node of the second transistor is connected to a first node of the third transistor and configured to output voltage (vo);
a second node of the third transistor is connected to a connection point between the first node of the first current source and a first node of the fifth transistor; and
both a first node and a second node of the fourth transistor are connected to both a second node of the fifth transistor and a first node of the first transistor;
wherein the operational amplifier further comprises a sixth transistor, wherein
the sixth transistor is connected in serial between the first node of fifth transistor and the first node of the first current source, and a connection point between the first node of the first current source and a second node of the sixth transistor is connected to a first node of the sixth transistor.

6. The operational amplifier of claim 5, wherein the input stage comprises a seventh transistor, an eighth transistor, a ninth transistor, a tenth transistor, and a third current source, wherein a second node of the tenth transistor is configured to receive a positive voltage input, and a second node of the seventh transistor is configured to receive a negative voltage input, a third node of the tenth transistor and a third node of the seventh transistor are connected to a first node of the third current source, a second node of the third current source is connected to a power supply (vdd), a first node of the an eighth transistor and a second node of the eighth transistor are connected to a second node of the ninth transistor, both a third node of the eighth transistor and a third node of the ninth transistor are connected to ground (gnd).

7. The operational amplifier of claim 6, wherein the third transistor, the fourth transistor, the fifth transistor, the sixth transistor, the seventh transistor and the tenth transistor are PMOS transistors, and the first transistor, the second transistor, the eighth transistor and the ninth transistor are NMOS transistors, wherein
- the first node of the first, second, third, fourth, fifth, sixth, seventh, eighth, ninth, and tenth transistors each comprises a drain;
- the second node of the first, second, third, fourth, fifth, sixth, seventh, eighth, ninth, and tenth transistors each comprises a gate; and
- the third node of the first, second, third, fourth, fifth, sixth, seventh, eighth, ninth, and tenth transistors each comprises a source.

8. A method in an operational amplifier, wherein the operational amplifier comprises:
an input stage;
an output stage communicatively coupled to the input stage, wherein the output stage further comprises a first transistor, a second transistor, a third transistor, a fourth transistor, a first current source, a fifth transistor, a sixth transistor and a second current source,
wherein a second node of the first transistor is connected to the input stage (vin), a third node of the first transistor is connected to a third node of the fourth transistor, ground (gnd), a third node of the fifth transistor and a third node of the third transistor, a first node of the first transistor is connected to a first node of the first current source, second node of the sixth transistor and a second node of the second transistor;
a third node of the sixth transistor and second node of the second current source, a second node of the first current source, and a third node of the second transistor are connected to a power supply (Vdd);
a first node of the second transistor is connected to a first node of the third transistor and configured to output voltage (vo);
a second node of the third transistor is connected to a connection point between a first node of the fifth transistor and a first node of the second current source; and
both a first node and a second node of the fourth transistor are connected to both second node of the fifth transistor and a first node of the sixth transistor;
wherein the method comprises
receiving, by the input stage, input voltage; and
outputting, by a connection point of the first node of the second transistor and the first node of the third transistor, the output voltage, wherein the second transistor is always on.

9. A method in an operational amplifier, wherein the operational amplifier comprises:
an input stage;

an output stage communicatively coupled to the input stage, wherein the output stage comprises first transistor, a second transistor, a third transistor, a fourth transistor, a fifth transistor, and a first current source, a third node of the fifth transistor and a third node of the third transistor are connected to a power supply (Vdd), a second node of the first transistor is connected to the input stage and connected to a second node of the second transistor;

a third node of the first transistor and a first node of the first current source, and a third node of the second transistor are connected to ground (gnd), both a second node and a first node of the fourth transistor are connected to the second node of the fifth transistor;

a first node of the second transistor is connected to a first node of the third transistor and configured to output voltage (vo);

a second node of the third transistor is connected to a connection point between the first node of the first current source and a first node of the fifth transistor; and both a first node and a second node of the fourth transistor are connected to both a second node of the fifth transistor and a first node of the first transistor;

wherein the method comprises receiving, by the input stage, input voltage; and outputting, by a connection point of the first node of the second transistor and the first node of the third transistor, the output voltage, wherein the second transistor is always on.

* * * * *